(12) United States Patent
Dyer et al.

(10) Patent No.: US 7,393,746 B2
(45) Date of Patent: Jul. 1, 2008

(54) POST-SILICIDE SPACER REMOVAL

(75) Inventors: Thomas W. Dyer, Pleasant Valley, NY (US); Sunfei Fang, LaGrangeville, NY (US); Jiang Yan, Newburgh, NY (US); Siddhartha Panda, Kanpur (IN); Yong Meng Lee, Singapore (SG); JunJung Kim, Paju (KR)

(73) Assignees: International Business Machines Corporation, Armonk, NY (US); Samsung Electronics Co. Ltd. (KR); Infineon Technologies North America Corporation, San Jose, CA (US); Chartered Semiconductor Manufacturing, Ltd., Singapore (SG)

( * ) Notice: Subject to any disclaimer, the term of this patent is extended or adjusted under 35 U.S.C. 154(b) by 50 days.

(21) Appl. No.: 11/548,870

(22) Filed: Oct. 12, 2006

(65) Prior Publication Data
US 2008/0090370 A1    Apr. 17, 2008

(51) Int. Cl.
*H01L 21/33* (2006.01)
(52) U.S. Cl. ........................ 438/257; 438/149; 438/197; 257/E21.01; 257/E21.218; 257/E21.248
(58) Field of Classification Search ................ 438/257, 438/149, 258, 197, 199, 506, 514, 651, 682, 438/755, 766, 734
See application file for complete search history.

(56) References Cited

U.S. PATENT DOCUMENTS 5,084,417 A * 1/1992 Joshi et al. .................. 438/653
6,096,647 A * 8/2000 Yang et al. .................. 438/682
6,284,669 B1 9/2001 Erdeljac et al.
6,297,114 B1 * 10/2001 Iwata et al. .................. 438/305
6,437,377 B1 8/2002 Ajmera
6,521,540 B1 2/2003 Li
7,064,071 B2 6/2006 Schwan
7,105,429 B2 * 9/2006 Jawarani ...................... 438/592
2004/0079993 A1 * 4/2004 Ning et al. ................... 257/347
2006/0046499 A1 3/2006 Liaw
2006/0108606 A1 5/2006 Saxler et al.
2006/0125051 A1 6/2006 Liaw

* cited by examiner

*Primary Examiner*—David Nhu
(74) *Attorney, Agent, or Firm*—Gibb & Rahman, LLC; Yuanmin Cai, Esq.

(57) ABSTRACT

A method forms a gate conductor over a substrate, forms spacers (e.g., nitride spacers) on sides of the gate conductor, and implants an impurity into exposed regions of the substrate not protected by the gate conductor and the spacers. Then the method forms a silicide on surfaces of the exposed regions of the substrate. The method forms a conformal protective layer (e.g., an oxide or other similar material) over the silicide, the spacers, and the gate conductor. Next, the method forms a non-conformal sacrificial layer (e.g., nitride or other material that can be selectively removed with respect to the protective layer) over the protective layer. A subsequent partial etching process partially etches the sacrificial layer such that relatively thinner regions of the sacrificial layer that are over the spacers are completely removed and the relatively thicker regions of the sacrificial layer that are over the substrate are not removed. The next step in the method removes only those portions of the protective layer that cover the spacers, without removing the portions of the protective layer that cover the silicide. As the spacers are now exposed and the silicide is protected by the protective and sacrificial layers, the method can safely remove the spacers without affecting the silicide.

6 Claims, 2 Drawing Sheets

POST-SILICIDE SPACER REMOVAL

BACKGROUND AND SUMMARY

The embodiments of the invention generally relate to transistor manufacturing and more particularly to a method of removing sidewall spacers after silicide has been formed.

A gate sidewall spacer is generally used to space the source/drain diffusions and silicide away from the device channel region (the shallow extension implant bridges the gap). Once silicide is formed, the spacer is typically left in place where it may adversely affect subsequent processes. For example, the spacer crowds the limited area between closely spaced gates leaving inadequate room to form good CA contacts. Also, the presence of the spacer forces the stress liner further from the device channel thereby limiting the effectiveness of stress transfer to the channel.

The problem with simply stripping the nitride spacer after silicide formation is that etchants suitable for nitride removal also erode silicide. Use of a sacrificial nitride deposited preferentially on the silicide has been attempted but the beneficial effect of protecting the silicide tends to be overwhelmed by the need to etch longer to remove both the spacer and the additional nitride from the gate sidewall. The net result is the same or more silicide erosion than the case where no sacrificial nitride is used.

In view of the foregoing, an embodiment of the invention provides a method of forming an integrated circuit transistor. The method forms a gate conductor over a substrate, forms spacers (e.g., nitride spacers) on sides of the gate conductor, and implants an impurity into exposed regions of the substrate not protected by the gate conductor and the spacers. Then, the method forms a silicide on surfaces of the exposed regions of the substrate.

The method forms a conformal protective layer (e.g., an oxide or other similar material) over the silicide, the spacers, and the gate conductor. Next, the method forms a non-conformal sacrificial layer (e.g., nitride or other material that can be selectively removed with respect to the protective layer) over the protective layer. Because it is non-conformal, the sacrificial layer comprises relatively thinner regions that are over the spacers (e.g., the non-horizontal surfaces) and relatively thicker regions that are over the substrate and the top of the gate conductor (e.g., the horizontal surfaces).

The non-conformal nature of the sacrificial layer allows a subsequent partial etching process to partially etch the sacrificial layer. For example, the partial etching process could be continued only for a limited time such that the relatively thinner regions of the sacrificial layer that are over the spacers are completely removed and the relatively thicker regions of the sacrificial layer that are over the substrate are not removed (while the thicker regions may be thinned somewhat). The partial etching of the sacrificial layer only exposes portions of the protective layer that cover the spacers. Because the portions of the protective layer that cover the spacers are now exposed, the next step in the method can remove only those portions of the protective layer that cover the spacers, without removing the portions of the protective layer that cover the silicide (which, at this stage of processing, are still covered by the remnants of the thicker portions of the sacrificial layer). The removing of the portions of the protective layer that cover the spacers comprises a selective etching process that attacks protective material and does not attack sacrificial material. As the spacers are now exposed and the silicide is protected by the protective and sacrificial layers, the method can safely remove the spacers without affecting the silicide. The removing of the spacers comprises a selective etching process that attacks spacer material and does not attack protective material. This process that removes the spacers can simultaneously remove the remnants of the sacrificial layer if they are formed of the same material. The protective layer can remain in place or can be replaced by an insulator layer.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
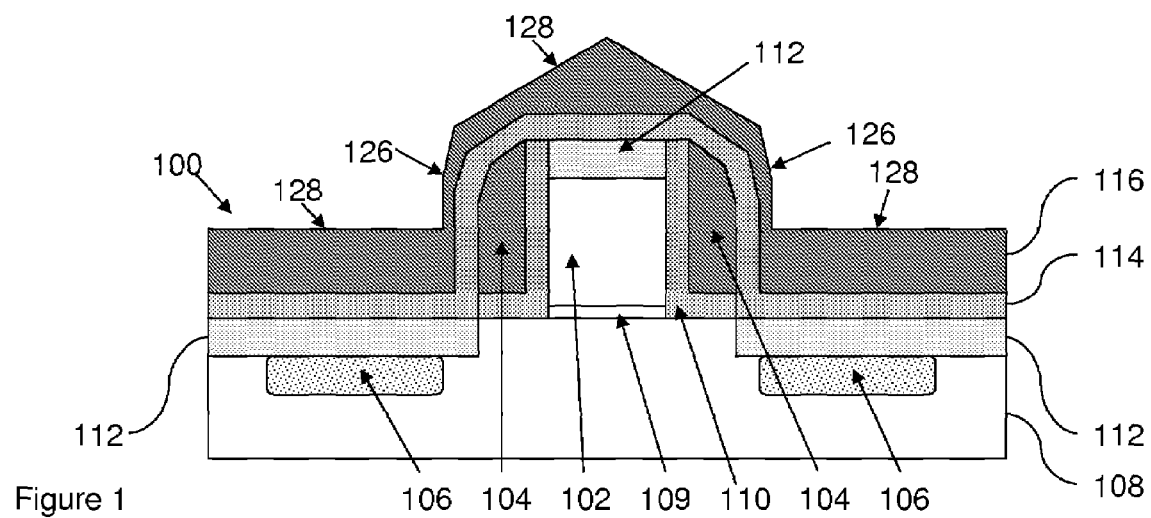
FIG. 1 is a cross-sectional schematic diagram of a partially completed transistor structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As discussed above, the problem with simply stripping the nitride spacer after silicide formation is that etchants suitable for nitride removal also erode silicide. Use of a sacrificial nitride deposited preferentially on the silicide has been attempted but the beneficial effect of protecting the silicide tends to be overwhelmed by the need to etch longer to remove both the spacer and the additional nitride from the gate sidewall. The net result is the same or more silicide erosion than the case where no sacrificial nitride is used.

In view of the foregoing, an embodiment of the invention provides a method of forming an integrated circuit transistor 100 (FIGS. 1-5). The method forms a gate conductor 102 over gate insulator 109 on a substrate 108, forms spacers 104 (e.g., nitride) on oxide insulators 110 positioned on sides of the gate conductor 102, and implants an impurity into exposed regions 106 of the substrate 108 not protected by the gate conductor 102 or the spacers 104. Then the method forms a silicide 112 on surfaces of the exposed regions of the substrate 108.

The specifics of processing techniques and materials used in the removal and formation/deposition of the various material layers is discussed in detail in U.S. Pat. Nos. 7,105,429; 7,064,071; 6,437,377; 6,284,669; and 6,521,540 and U.S. Patent Publications 2006/0125051; 2006/0108606; and 2006/0046449 (incorporated herein by reference) and the details of such processing is not discussed in detail herein so as to focus the reader on the salient points of the invention. Further, the method can include other processing steps/structures not mentioned herein that are discussed in the incorporated references.

The method forms a conformal protective layer 114 (e.g., an oxide or other similar material) over the silicide 112, the spacers 104, and the gate conductor 102. Next the method forms a non-conformal sacrificial layer 116 (e.g., nitride or other material that can be selectively removed with respect to the protective layer 114) over the protective layer 114. For example, the method can deposit a blanket oxide layer (low temperature oxide-LTO) 114 after silicide 112 formation followed by a highly non-conformal high density plasma (HDP) nitride deposition 116 on the oxide layer 114. Because it is non-conformal, the sacrificial layer 116 comprises relatively thinner regions 126 that are over the spacers 104 (e.g., the non-horizontal surfaces) and relatively thickers regions 128 that are over the substrate 108 and the top of the gate conductor 102 (e.g., the horizontal surfaces). For purposes of this application, the positional terms top, above, over, bottom, below, under, horizontal, vertical, etc. are with respect to the manner in which the transistor is oriented in the drawings. As would be understood by one ordinarily skilled in the art, the transistor structure can be turned on its side, upside-down, etc. without altering the relative positions of the structures discussed herein and the positional terms used herein would change as the structures change relative positions with respect to one another. Therefore, one ordinarily skilled in the art would understand the meaning of such relative positional terms, irrespective of the actual orientation of the transistor with respect to the viewer.

Figure 2:
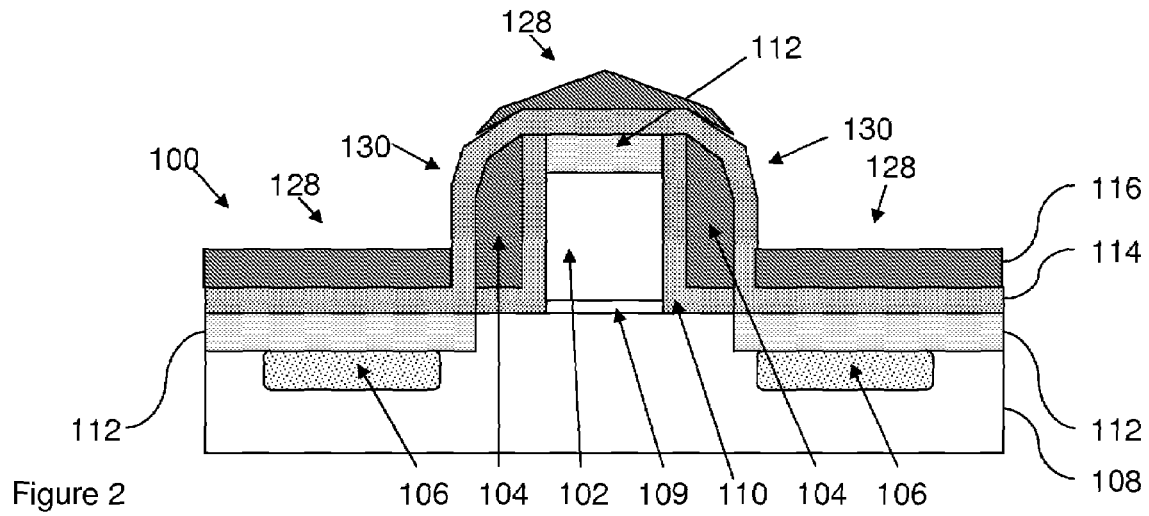
FIG. 2 is a cross-sectional schematic diagram of a partially completed transistor structure.
Figure 3:
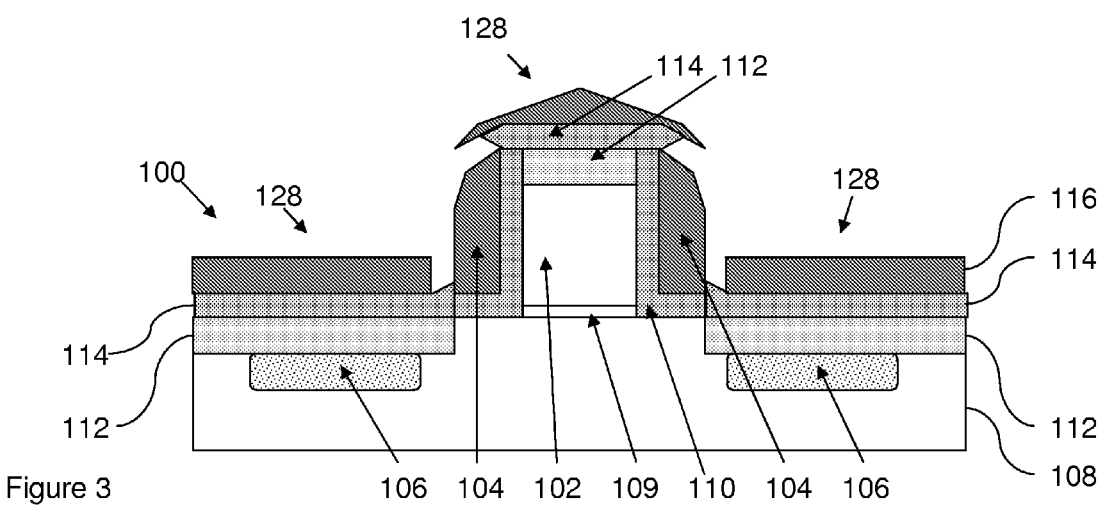
FIG. 3 is a cross-sectional schematic diagram of a partially completed transistor structure.

The non-conformal nature of the sacrificial layer 116 allows a subsequent partial etching process to partially etch the sacrificial layer 116, as shown in FIG. 2. For example, the partial etching process could be continued only for a limited time such that the relatively thinner regions 126 of the sacrificial layer 116 that are over the spacers 104 are completely removed and the relatively thicker regions 128 of the sacrificial layer 116 that are over the substrate 108 are not removed (while the thicker regions 128 may be thinned somewhat).

The partial etching of the sacrificial layer 116 only exposes portions 130 of the protective layer 114 that cover the spacers 104. Since the HDP nitride 116 is much thinner on the gate 102 sidewall 104 than on the silicided regions 112, a partial etch-back can expose the oxide 114 on the spacers 104 without exposing the oxide 114 on the silicide 112. This oxide 114 can then be removed selectively, thereby exposing the nitride spacer 104.

Thus, because the portions 130 of the protective layer 114 that cover the spacers 104 are now exposed, the next step in the method (shown in FIG. 3) can remove only those portions 130 of the protective layer 114 that cover the spacers 104, without removing the portions of the protective layer 114 that cover the silicide 112 (which, at this stage of processing, are still covered by the remnants of the thicker portions 128 of the sacrificial layer 116). The removing of the portions of the protective layer 114 that cover the spacers 104 comprises a selective etching process that attacks protective material (e.g., oxide) and does not attack sacrificial material (e.g., nitride).

Figure 4:
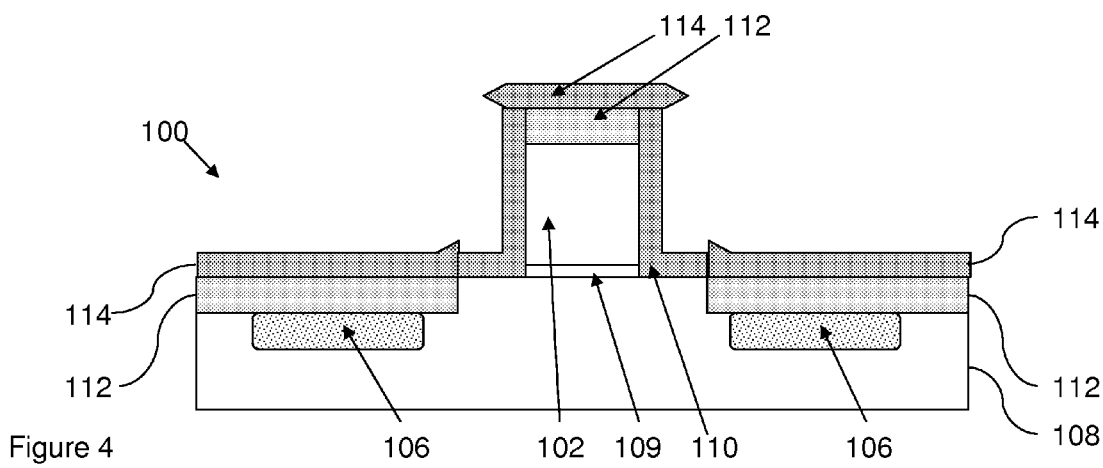
FIG. 4 is a cross-sectional schematic diagram of a partially completed transistor structure.

As the spacers 104 are now exposed and the silicide 112 is protected by the protective 114 and sacrificial layers 116, the method can safely remove the spacers 104 without affecting the silicide 112, as shown in FIG. 4. The removing of the spacers 104 comprises a selective etching process that attacks spacer material 104 and does not attack protective material 114. For example, the nitride spacers 104 can then be removed by nitride etch. Using a nitride etch with good selectivity to oxide ensures that the spacer 104 can be completely removed while retaining the protective oxide layer 114 on the silicide 112. Thus, this invention enables complete removal of the nitride spacer 104 without any silicide 112 erosion. This process that removes the spacers 104 can simultaneously remove the remnants of the sacrificial layer 116 if they are formed of the same material, as shown in FIG. 4. The protective layer 114 can remain in place or can be removed to allow further processing, such as additional doping, formation of contacts, insulators, etc.

In an alternative embodiment, the removal of the thinner portions 126 of the sacrificial layer 116 and the removal of the exposed portions 130 of the protective layer 114 can comprise a continuous etching process that is not selective. Instead, such a continuous etching process would be designed to attack both the sacrificial layer 116 (e.g., nitride) and the protective layer 114 (e.g., oxide). In all the foregoing embodiments, the etch parameters and the thickness of the thicker portions 128 of the sacrificial layer 116 are designed such that the thicker portions 128 of the sacrificial layer are not etched away before the spacers 104 are removed. Thus, in all embodiments, the thicker portions 128 are in place during the removal of the spacers 104 so that the underlying protective layer 114 and silicide regions 112 are not eroded by process that removes the spacers 104.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of forming an integrated circuit transistor, said method comprising:

forming a gate conductor over a substrate;

forming spacers on sides of said gate conductor;

implanting an impurity into exposed regions of said substrate not protected by said gate conductor and said spacers;

forming a silicide on surfaces of said exposed regions of said substrate;

forming a protective layer over said silicide, said spacers, and said gate conductor;

forming a non-conformal sacrificial layer over said protective layer, wherein said non-conformal sacrificial layer comprises relatively thinner regions that are over said spacers and relatively thicker regions that are over said substrate;

partially etching said non-conformal sacrificial layer such that said relatively thinner regions of said non-conformal sacrificial layer that are over said spacers are completely removed and said relatively thicker regions of said non-conformal sacrificial layer that are over said substrate are not removed, wherein said partially etching of said non-conformal sacrificial layer exposes portions of said protective layer that cover said spacers;

removing said portions of said protective layer that cover said spacers such that said spacers are exposed and said silicide is not exposed; and removing said spacers without affecting said silicide.

2. The method according to claim 1, wherein said removing of said portions of said protective layer that cover said spacers comprises a selective etching process that attacks protective material and does not attack sacrificial material.

3. The method according to claim 1, wherein said removing of said spacers comprises a selective etching process that attacks spacer material and does not attack protective material.

4. A method of forming an integrated circuit transistor, said method comprising:

forming a gate conductor over a substrate;

forming nitride spacers on sides of said gate conductor;

implanting an impurity into exposed regions of said substrate not protected by said gate conductor and said nitride spacers;

forming a silicide on surfaces of said exposed regions of said substrate;

forming an oxide layer over said silicide, said nitride spacers, and said gate conductor;

forming a said non-conformal nitride layer over said oxide layer, wherein said non-conformal nitride layer comprises relatively thinner regions that are over said nitride spacers and relatively thicker regions that are over said substrate;

partially etching said non-conformal nitride layer such that said relatively thinner regions of said non-conformal nitride layer that are over said nitride spacers are completely removed and said relatively thicker regions of said non-conformal nitride layer that are over said substrate are not removed, wherein said partially etching of said non-conformal nitride layer exposes portions of said oxide layer that cover said nitride spacers;

removing only said portions of said oxide layer that cover said nitride spacers such that said nitride spacers are exposed and said silicide is not exposed; and removing said nitride spacers without affecting said silicide.

5. The method according to claim 4, wherein said removing of said portions of said oxide layer that cover said nitride spacers comprises a selective etching process that attacks oxide and does not attack nitride.

6. The method according to claim 4, wherein said removing of said nitride spacers comprises a selective etching process that attacks nitride and does not attack oxide.

* * * * *